(12) United States Patent
Park et al.

(10) Patent No.: US 7,969,761 B2
(45) Date of Patent: Jun. 28, 2011

(54) SEMICONDUCTOR MEMORY DEVICE, MEMORY DEVICE SUPPORT AND MEMORY MODULE

(75) Inventors: Sungjoo Park, AnYang (KR); Ki-Hyun Ko, Yongin (KR); Young Yun, Yongin (KR); Sookyung Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/774,015

(22) Filed: May 5, 2010

(65) Prior Publication Data

US 2010/0214814 A1 Aug. 26, 2010

Related U.S. Application Data

(63) Continuation of application No. 11/905,675, filed on Oct. 3, 2007, now Pat. No. 7,738,277.

(30) Foreign Application Priority Data

Feb. 14, 2007 (KR) .................. 10-2007-0015367

(51) Int. Cl.
*G11C 5/06* (2006.01)
(52) U.S. Cl. .......................................... 365/63; 365/51
(58) Field of Classification Search .................... 365/63, 365/51; 257/286; 711/167
See application file for complete search history.

(56) References Cited

U.S. PATENT DOCUMENTS

| | | | |
|---|---|---|---|
| 6,038,132 A * | 3/2000 | Tokunaga et al. ............. 361/760 |
| 6,145,060 A | 11/2000 | Takasu et al. | |
| 6,424,034 B1 | 7/2002 | Ahn et al. | |
| 6,713,854 B1 | 3/2004 | Kledzik et al. | |
| 6,757,751 B1 | 6/2004 | Gene | |
| 6,943,454 B1 | 9/2005 | Gulachenski et al. | |
| 7,123,497 B2 | 10/2006 | Matsui et al. | |
| 2002/0159284 A1 * | 10/2002 | Funaba et al. .................. 365/63 |
| 2003/0149855 A1 * | 8/2003 | Shibata et al. ................ 711/200 |
| 2005/0139978 A1 | 6/2005 | Hirose | |
| 2006/0126369 A1 | 6/2006 | Raghuram | |
| 2006/0192282 A1 | 8/2006 | Suwa et al. | |
| 2006/0255459 A1 | 11/2006 | Muff et al. | |

FOREIGN PATENT DOCUMENTS

| | | |
|---|---|---|
| CN | 1194715 | 9/1998 |
| JP | 2004-327474 | 11/2004 |
| JP | 2006-237385 | 9/2006 |

OTHER PUBLICATIONS

Chinese Office Action issued Mar. 14, 2011 for Chinese Patent Application No. 200810005626.6.

* cited by examiner

*Primary Examiner* — Vu A Le

(74) *Attorney, Agent, or Firm* — Harness, Dickey & Pierce

(57) ABSTRACT

In one embodiment, the semiconductor memory device includes at least a first semiconductor memory die, and a surface of the semiconductor memory device includes a plurality of connectors. At least one of the plurality of connectors is electrically connected to the first semiconductor memory die. The plurality of connectors include at least first and second control signal connectors. The first control signal connector is for a first control signal of a first type, the second control signal connector is for a second control signal of the first type, and the first and second control signal connectors are disposed in different areas of the surface. For example, the first type may be a chip select signal, a clock enable signal, or an on die termination enable signal.

11 Claims, 10 Drawing Sheets

SEMICONDUCTOR MEMORY DEVICE, MEMORY DEVICE SUPPORT AND MEMORY MODULE

CROSS-REFERENCE TO RELATED APPLICATIONS

This application is a continuation of U.S. application Ser. No. 11/905,675 filed Oct. 3, 2007 now U.S. Pat. No. 7,738,277, which claims priority under 35 U.S.C. §119 on Korean application 10-2007-0015367, filed Feb. 14, 2007, the entire contents of which are incorporated by reference.

BACKGROUND OF THE INVENTION

1. Field of the Invention

The present invention relates to a semiconductor memory device, a memory device support and a memory module.

2. Related Art

FIG. 1 illustrates a prior art memory module. As shown, the memory module includes a support 10, which is usually a PCB (printed circuit board). A plurality of semiconductor memory chips 12 are mounted on each side of the support 10. The support 10 includes a plurality of vias and conductive lines (not shown) to connect the plurality of semiconductor memory chips 12 to terminals 14 of the memory module. The vias and conductive lines form control signal lines and internal data lines. The memory chips 12 on both sides of the support 10 are connected to the control signal lines such that the memory chips 12 receive the same control signals from the terminals 14. As a result, and as graphically shown, the memory chips 12 mounted on both sides of the support 10 may be conceptually thought of as outputting to a single data line 16. Stated another way, there is a single set of memory chips controlled by the same control signals, and such a memory module is said to have a rank of one. For example purposes, each memory chip 12 is also shown as outputting 4 bits at a time such that the memory module as a whole may transfer 72 bits over the data line 16.

In contrast to the single rank memory module of FIG. 1, FIG. 2 illustrates a prior art memory module having a rank of two. As shown in FIG. 2, a support 110 includes a first set of semiconductor memory chips 112'-1 mounted on the first side of the support 110 and a second set of semiconductor memory chips 112'-2 mounted on the opposing, second side of the support 110. The support 110 includes vias and conductive lines such that the first and second sets of semiconductor memory chips 112'-1 and 112'-2 are connected to terminals 114'. As is well known, the first and second sets of semiconductor memory chips 112'-1 and 112'-2 are connected to the control signal lines and internal data lines such that only one of the first and second sets of semiconductor memory chips 112'-1 and 112'2 are enabled at one time. Accordingly, while the first and second sets of semiconductor memory chips 112'-1 and 112'-2 are connected to the same terminals 114', the memory module may be conceptually thought of as having two separate data lines 116'-1 and 116'-2.

For instance, usually one or more signals called chip select or enable signals are applied to at least one of the control lines to control which set of chips are enabled. If the chips select signal is set to a logic level zero, then the first set of semiconductor memory chips 112'-1 is enabled, and may be thought of as being connected to the first data line 116'-1. However, if the chip select signal is a logic 1, then the second set of semiconductor memory chips 112'-2 is enabled and may be thought of as connected to the second data line 116'-2. Because there are two separately selectable sets of semiconductor memory chips in this memory module, the rank of the memory module is said to be two. For example purposes, each memory chip 112' is also shown as outputting 8 bits at a time such that the memory module as a whole may transfer 72 bits over the data line 116'1 or 116'-2.

FIG. 3 illustrates yet another prior art memory module. The memory module of FIG. 3 is similar of the memory module of FIG. 2 in that the rank of the memory module is two. However, the memory module of FIG. 3 includes stacks of semiconductor memory chips mounted on each side of a support. Namely, as shown in FIG. 3, the semiconductor module includes a support 20. A first side or face 21 of the support 20 includes a plurality of mounting locations 26-1 thru 26-n. A first set 22 of semiconductor memory devices 22-1 thru 22-n are respectively mounted at the mounting locations 26-1 thru 26-n. Similarly, a second side or face 23 of the support 20 includes a plurality of mounting locations 28-1 thru 28-n. A second set 24 of semiconductor memory device 24-1 thru 24-n are respectively mounted at the mounting locations 28-1 thru 28-n. Each of the first and second sets of semiconductor memory devices 22 and 24 has a structure such as shown in FIG. 4A.

FIG. 4A illustrates a prior art semiconductor memory device having a plurality of stacked dies or chips. In the example of FIG. 4A, the semiconductor memory device includes two semiconductor memory dies or chips 10-1 and 10-2. Each of the stacked dies or chips 10-1 or 10-2 has its inputs and outputs electrically connected to associated external pads in an array 12 of external pads on an external surface of the memory device. As is well known, the array of external pads 12 may be a ball grid array.

As shown in FIG. 4A, the array 12 includes a left side area 12-1, a center area 12-2 and a right side area 12-3. The center area 12-2 does not include external pads such that the array 12 is really a left side array 12-1 and a right side array 12-3. As further shown, each external pad in the left and right side arrays 12-1 and 12-3 are associated with particular signals, which are well known in the art. Because the signals associated with each pad are well known, they will not be discussed in detail. Instead, for the purposes of discussion, only the external pads highlighted in the left and right side arrays 12-1 and 12-3 will be discussed.

As shown, the left side array 12-1 includes external pads for a first clock enable signal CKE0 and a second clock enable signal CKE1. The first die 10-1 is connected to the external pad associated with first clock enable signal CKE0, and the second die 10-2 is connected to the external pad associated with the second clock enable signal CKE1. Accordingly, in this disclosure those external pads may also be referred to as the first and second clock enable external pads cke0 and cke1. Namely, for the array 12, upper case will denote the signal and lower case the pad. The right side array 12-3 includes respective external pads for first and second chip select signals CSB0 and CSB1, and further includes respective external pads for first and second on-die termination enable signals ODT0 and ODT1. The first die 10-1 is connected to the external pads associated with the first chip select signal CSB0 and first on-die termination enable signal ODT0. The second die 10-2 is connected to the external pads associated with the second chip select signal CSB1 and the second on-die termination enable signal ODT1.

The chip select signals CSB0 and CSB1 dictate whether the first chips 10-1 or the second chips 10-2 in the semiconductor memory devices 22 or 24 are enabled. The on-die termination signals ODT0 and ODT1 dictates whether the first chips 10-1 or the second chips 10-2 in the semiconductor memory devices 22 or 24 have on-die termination enabled, and the clock enable signals dictate whether the first chips 10-1 or the second chips 10-2 in the semiconductor memory devices 22 or 24 have their clocks enabled.

Returning to FIG. 3, the support 20 includes vias and conductive lines such that the first and second sets of semiconductor memory devices 22 and 24 are connected to terminals (not shown) such as shown in FIGS. 1 and 2. As is well known, the first and second sets of semiconductor memory devices 22 and 24 have the same external pads in the array 12 connected to the same control signal lines and terminals such that only the first chips 10-1 or the second chips 10-2 in the first and second sets of semiconductor memory devices 22 and 24 are enabled at one time. Accordingly, while the first and second sets of semiconductor memory devices 22 and 24 are connected to the same terminals, the memory module has a rank of two and may be conceptually thought of as having two separate data lines.

FIG. 3 illustrates two example control signal lines CON1L and CON2L as well as the clock signal line CKL. The first and second control signal lines CON1L and CON2L each carry a respective control signals CON1 and CON2, while the clock signal line CKL carries the clock signal CK. However, it will be appreciated that more than just the two illustrated control signal lines CON1L and CON2L exist. For example the first and second control signals CON1 and CON2 may be the first and second clock enable signals CKE0 and CKE1, the first and second chip select signals CSB0 and CSB1, or the first and second on-die termination signals ODT0 and ODT1. Each control signal line CON1L, CON2L and CKL are terminated by a resistance Rtt connected to a termination voltage Vtt.

FIG. 4B illustrates the connection a corresponding pair of memory devices to the support in FIG. 3. In particular, FIG. 4B illustrates a portion of the connections of a memory device 22 and oppositely facing, or corresponding, memory device 24 to the support 20. As shown, a pin or pad 1c1 of the first die 10-1 in the memory device 22 is electrically connected to an external pad c1 in the array 12, and a pin or pad 2c2 of the second die 10-2 in the memory device 22 is electrically connected to an external pad c2 in the array 12. In this example, the external pads c1 and c2 may correspond to the first and second clock enable external pads cke0 and cke1, respectively. Furthermore, the clock signal pad 1ck of the first die 10-1 of the memory device 22 and the clock signal pad 2ck of the second die 10-2 are connected to the external clock signal pad ck in the array 12.

Similarly, for the opposite facing semiconductor memory device 24, a pin or pad 1c1' of the first die 10-1 in the memory device 24 is electrically connected to an external pad c1' in the array 12, and a pin or pad 2c2' of the second die 10-2 in the memory device 24 is electrically connected to an external pad c2' in the array 12. In this example, the external pads c1' and c2' may correspond to the first and second clock enable external pads cke0 and cke1, respectively. Furthermore, the clock signal pad 1ck' of the first die 10-1 of the memory device 24 and the clock signal pad 2ck' of the second die 10-2 are connected to the external clock signal pad ck' in the array 12.

As shown in FIG. 4B, the semiconductor memory device 24 is flipped with respect to the semiconductor memory device 22 and the left side array 12-1 of the semiconductor memory device 24 faces opposite the right side array 12-3 of the semiconductor memory device 22. Likewise, the right signal array 12-3 of the semiconductor memory device 24 faces opposite the lefts side array 12-1 of the semiconductor memory device 22.

The external pad c1 of the memory device 22 is connected to a first control signal pad C1 of the support 20, and the first control signal pad C1 is connected by a first control signal via C1-1 to the first control signal line CON1L at a point b. The corresponding external pad c1' of the memory device 24 is connected to a first control signal pad C1' of the support 20, and the first control signal pad C1' is connected by a first control signal via C1-1' to the first control signal line CON1L at a point b'.

The external pad c2 of the memory device 22 is connected to a second control signal pad C2 of the support 20, and the second control signal pad C2 is connected by a second control signal via C2-1 to the second control signal line CON2L at a point a. The corresponding external pad c2' of the memory device 24 is connected to a second control signal pad C2' of the support 20, and the second control signal pad C2' is connected by a second control signal via C2-1' to the second control signal line CON2L at a point a'.

The external clock signal pad ck of the memory device 22 is connected to a clock signal pad CKP of the support 20, and the corresponding external clock signal pad ck' of the memory device 24 is connected to a clock signal pad CKP' of the support 20. The clock signal pads CKP and CKP' are connected by a through-hole via CK1-1 to the clock signal line CKL at point d.

As will be appreciated, the first dies 10-1 in the first and second memory devices 22 and 24 form a first set of chips controlled by the first set of control signals (e.g., clock enable signal CKE0, chip select signal CSB0, etc.), and the second dies 10-2 in the first and second memory devices 22 and 24 form a second set of chips controlled by the second set of control signals (e.g., clock enable signal CKE1, chip select signal CSB1, etc.). Accordingly, the rank of the memory module illustrated in FIG. 3 is two.

As will be further appreciated, because of the separation between points b and b' as well as a and a', the control signals on the first and second control signal lines CON1L and CON2L are received at different times by the first and second semiconductor memory devices 22 and 24. This is referred to as skew, and may cause timing problems in the operation of the memory module.

Also, a number of vias in the support 20 are used to connect the pads of the support 20 to the signal lines CON1L, CON2L and CKL. As is known, the support 20 is generally a PCB, which is comprised of several layers. The signal lines CON1L, CON2L and CKL are formed on an internal layer of the PCB. Accordingly vias are used to electrically connect pads on external layers of the PCB to the signal lines. FIG. 5 illustrates different types of vias: a blind via, a buried via and a through hole via. Generally, a via is a hole through one or more layers of the PCB that has been filled with conductive material. A blind via leads from one of the external layers to one of the internal layers of the PCB. A buried via leads from one internal layer to another internal layer of the PCB. A through hole via leads from one external layer to the other external layer of the PCB. As shown in FIG. 4B, a through hole via is used to connect clock signal pads CKP and CKP' to the clock signal line CKL. Also, four blind vias C1-1, C1-1', C2-1 and C2-1' are used to connect the pads C1, C1', C2 and C2' to their respective control signal lines CON1L and CON2L.

SUMMARY OF THE INVENTION

The present invention relates to a semiconductor memory device.

In one embodiment, the semiconductor memory device includes at least a first semiconductor memory die, and a surface of the semiconductor memory device includes a plurality of connectors. At least one of the plurality of connectors is electrically connected to the first semiconductor memory die. The plurality of connectors include at least first and second control signal connectors. The first control signal connector is for a first control signal of a first type, the second control signal connector is for a second control signal of the first type, and the first and second control signal connectors are disposed in different areas of the surface. For example, the first type may be a chip select signal, a clock enable signal, or an on die termination enable signal.

In one embodiment, the surface includes a first area spaced apart from a second area. The first area includes a first portion of the plurality of connectors and the second area includes a second portion of the plurality of connectors. The first portion of the plurality of connectors includes the first control signal connector, and the second portion of the plurality of connectors includes the second control signal connector.

Yet another embodiment further includes at least a second semiconductor memory die stacked on the first semiconductor memory die, and at least one of the plurality of connectors is electrically connected to the second semiconductor memory die.

The present invention also relates to a memory device support.

In one embodiment, the support includes a substrate having a first surface and an oppositely facing second surface. The first surface includes a first plurality of connectors for electrically connecting to a first semiconductor memory device. The second surface includes a second plurality of connectors for electrically connecting to a second semiconductor memory device. The first plurality of connectors includes first and second control signal connectors of a first type, and the first and second control signal connectors are disposed on different areas of the first surface. The second plurality of connectors includes third and fourth control signal connectors of the first type, and the third and fourth control signal connectors are disposed on different areas of the second surface. The third control signal connector being electrically connected to the first control signal connector and the fourth control signal connector are electrically connected to the second control signal connector. The area of the first surface including the first control signal connector mirrors the area of the second surface including the third control signal connector, and the area of the second surface including the second control signal connector mirrors the area of the second surface including the fourth control signal connector.

According to another embodiment, the memory device support, includes a substrate having a first surface and an oppositely facing second surface. The first surface includes a first plurality of connectors for electrically connecting to a first semiconductor memory device. The second surface includes a second plurality of connectors for electrically connecting to a second semiconductor memory device. The first plurality of connectors includes a first clock signal connector and first and second control signal connectors. The second plurality of connectors includes a second clock signal connector and third and fourth control signal connectors. The first and third control signal connectors are electrically connected by a first though hole via in the substrate. The second and fourth control signal connectors are electrically connected by a second through hole via in the substrate. The first and second clock signal connectors are electrically connected by a third through hole via.

The present invention is still further directed to a memory module.

In one embodiment, the memory module includes a support substrate having a first face and an oppositely facing second face. The first face has at least one first mounting section, and the second face has at least one second mounting section. A semiconductor memory device is mounted in each first mounting section and in each second mounting section. Each semiconductor memory device includes at least a first semiconductor memory die, and a surface including a plurality of connectors. At least one of the plurality of connectors is electrically connected to the first semiconductor memory die, and at least one of the plurality of connectors is electrically connected to the support. The plurality of connectors includes at least first and second control signal connectors. The first control signal connector is for a first control signal of a first type, and the second control signal connector is for a second control signal of the first type. The first and second connectors are disposed in different areas of the surface.

According to yet another embodiment, the memory module includes a support substrate having a first face and an oppositely facing second face. The first face has at least one first mounting section, and the second face has at least one second mounting section. The support has at least a first control line and a second control line disposed therein. Each first mounting section has a first electrical connector arrangement and each second mounting section has a second electrical connector arrangement. A semiconductor memory device is mounted in each first mounting section and each second mounting section. Each semiconductor memory device includes at least first and second semiconductor memory dies and a third electrical connector arrangement. The third electrical connector arrangement electrically connected to one of the first and second electrical connector arrangements. The third electrical connector arrangement includes a surface having a plurality of connectors. The plurality of connectors includes at least a first control signal connector electrically connected to the first semiconductor memory die and a second control signal connector electrically connected to the second semiconductor memory die. The first and second control signal connectors are disposed in different areas of the surface. The second and third electrical connector arrangements are configured such that the semiconductor memory devices mounted on the first face have the first semiconductor memory dies electrically connected to the first control line and the second semiconductor memory dies electrically connected to the second control line. The semiconductor memory devices mounted on the second face have the second, semiconductor memory dies electrically connected to the first control line and the first semiconductor memory dies electrically connected to the second control line.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DETAILED DESCRIPTION OF THE EMBODIMENTS

Figure 1:
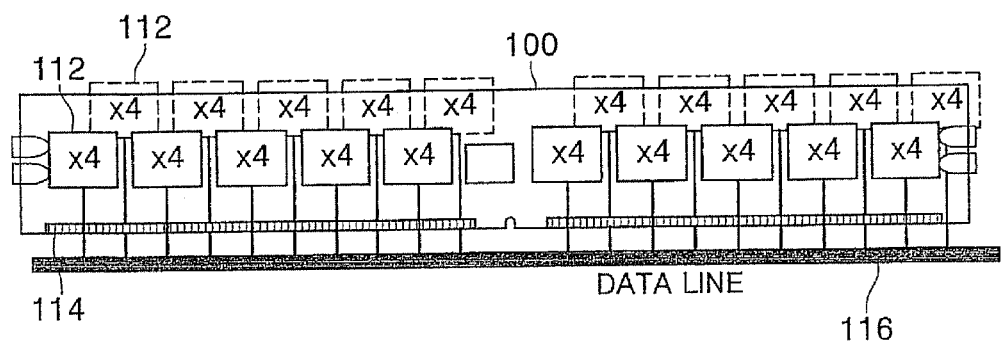
FIG. 1 illustrates a prior art memory module having a rank of one.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific tee used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 6:
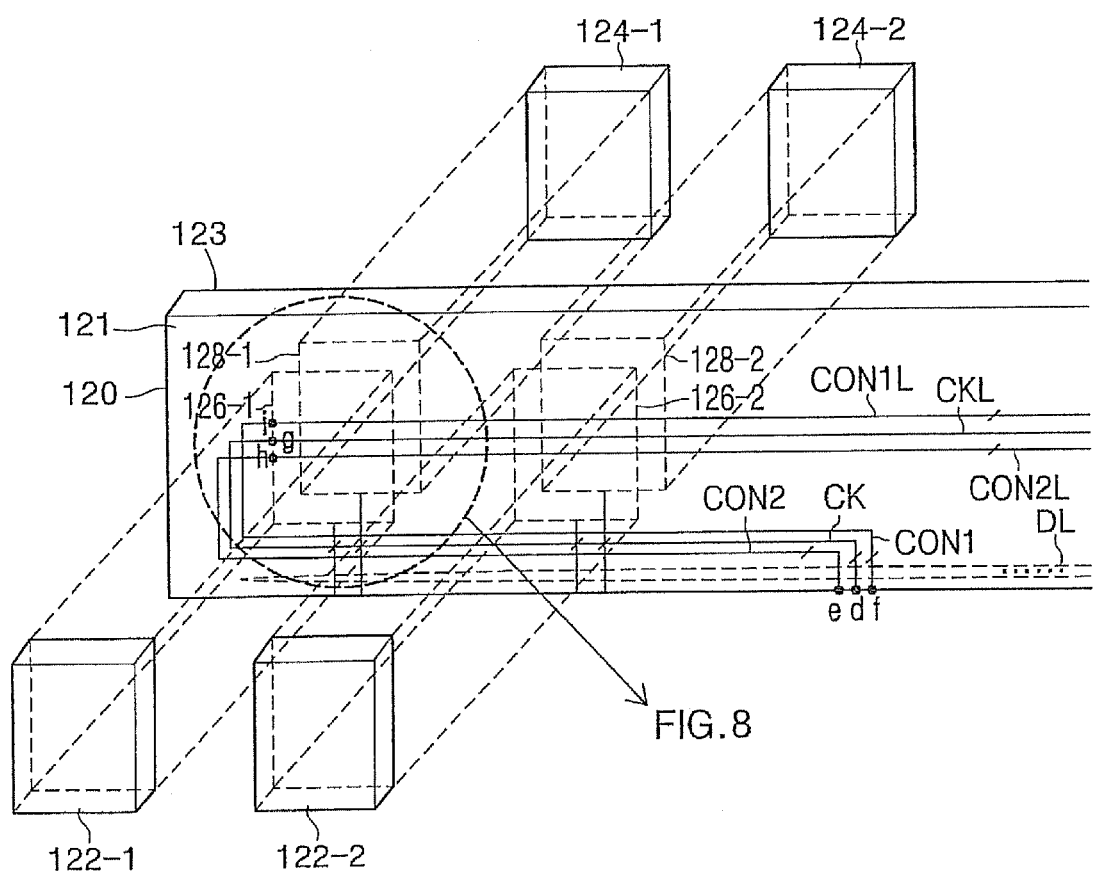
FIG. 6 illustrates a memory module according to an example embodiment of the present invention.

FIG. 6 illustrates a memory module according to an embodiment of the present invention. The memory module of FIG. 6 includes stacks of semiconductor memory chips mounted on each side of a support. Namely, as shown in FIG. 6, the semiconductor module includes a support 120. The support 120 may be a printed circuit board (PCB), but is not limited to this embodiment. A first side or face 121 of the support 120 includes a plurality of mounting locations 126-1 thru 126-n. A first set 122 of semiconductor memory devices 122-1 thru 122-n are respectively mounted at the mounting locations 126-1 thru 126-n. Similarly, a second side or face 123 of the support 120 includes a plurality of mounting locations 128-1 thru 128-n. A second set 124 of semiconductor memory devices 124-1 thru 124-n are respectively mounted at the mounting locations 128-1 thru 128-n. Each of the first and second sets of semiconductor memory devices 122 and 124 has a structure such as shown in FIG. 7.

Figure 7:
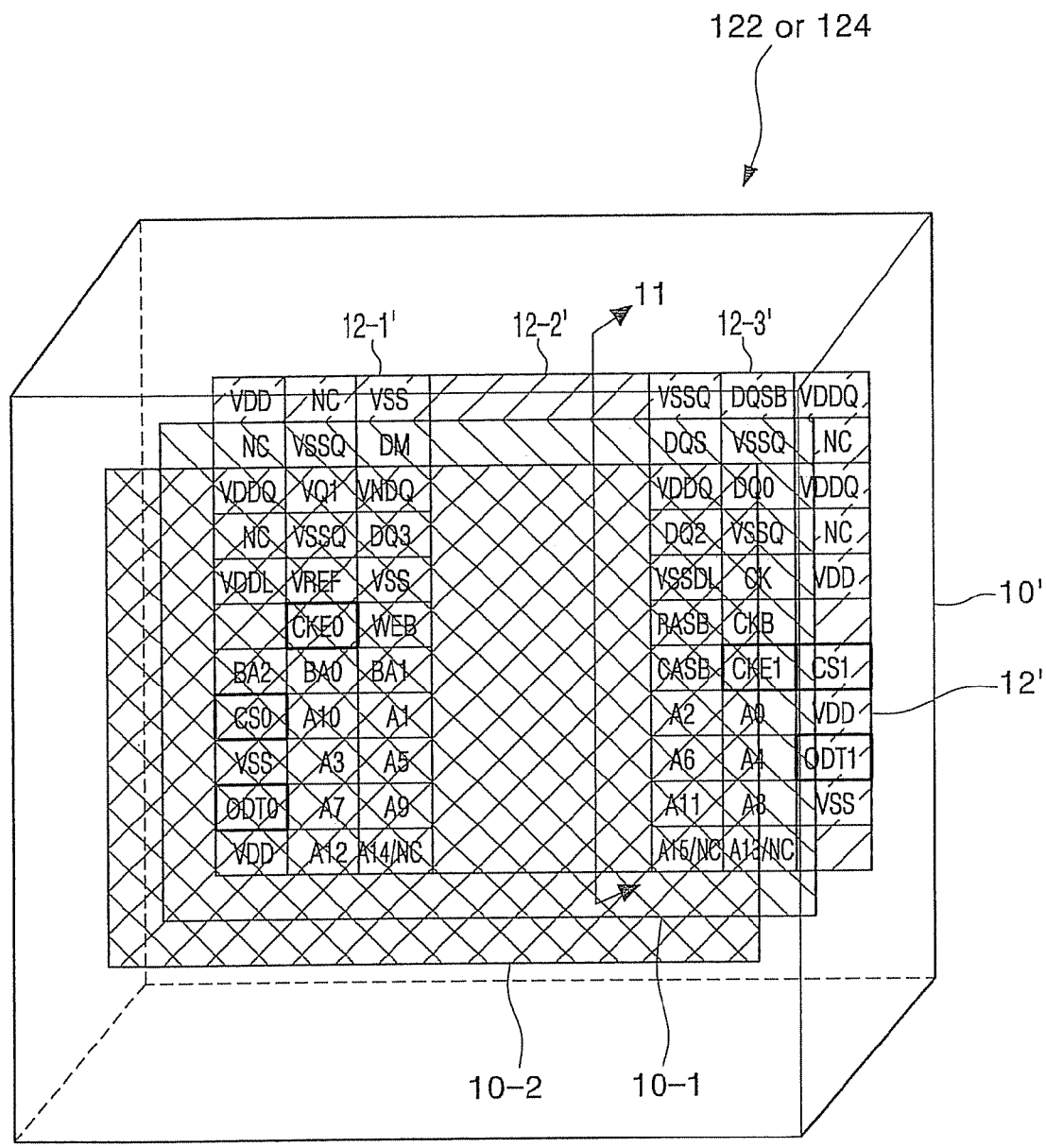
FIG. 7 illustrates the external pad structure of the stacked die semiconductor memory device of FIG. 6 according to an example embodiment of the present invention.

FIG. 7 illustrates a semiconductor memory device having a plurality of stacked dies or chips. The semiconductor memory devices 122 and 124 may also be referred to as semiconductor chip packages. In the example of FIG. 7, the semiconductor memory device or chip package includes two semiconductor memory dies or chips 10-1 and 10-2. Each of the stacked dies or chips 10-1 or 10-2 has its inputs and outputs electrically connected to associated external connectors in an array 12' of external connectors on an external surface of the memory device or chip package. The array of external connectors 12' may be a ball grid array, but the present invention is not limited to this embodiment. For example, the connectors 12 may be pads. For purposes of example only, the connectors will be referred to as pads in the remainder of the description.

As shown in FIG. 7, the array 12' includes a left side area 12-1', a center area 12-2' and a right side area 12-3'. The center area 12-2' does not include external pads such that the array 12' is really a left side array 12-1' and a right side array 12-3' disposed on either side of a center line 11. As further shown, each external pad in the left and right side arrays 12-1' and 12-3' are associated with particular signals, which are well known in the art. Because the signals associated with each pad are well known, they will not be discussed in detail. Instead, for the purposes of discussion, only the external pads highlighted in the left and right side arrays 12-1' and 12-3' will be discussed.

As shown, the left side array 12-1' does not include both pairs of control signals for a particular function. Similarly, the right side array 12-3' does not include both pairs of control signals for a particular function. For instance, as shown in FIG. 7, the external pads for a first clock enable signal CKE0, a first chip select signal CS0 and a first on-die termination signal ODT0 are in the left side array 12-1'. The external pads for a second clock enable signal CKE1, second chip select signal CS1 and second on-die termination signal ODT1 are in the right side array 12-3'. For reference purposes, lower reference labels will be used to designate the external pads and upper case reference labels will be used to designate the signals associated with the external pads. For example, chip select external pad cs0 is associated with chip select signals CS0.

The first die 10-1 is connected to the first clock enable external pad cke0, the first chip select external pad cs0 and the first on-die termination pad odt0. The second die 10-2 is connected to the second clock enable external pad cke1, the second chip select external pad cs1 and the second on-die termination external pad odt1.

The chip select signals CS0 and CS1 dictate whether the first chips 10-1 or the second chips 10-2 in the semiconductor memory devices 122 or 124 are enabled. The on-die termination signals ODT0 and ODT1 dictate whether the first chips 10-1 or the second chips 10-2 in the semiconductor memory devices 122 or 124 have on-die termination enabled, and the clock enable signals CKE0 and CKE1 dictate whether the first chips 10-1 or the second chips 10-2 in the semiconductor memory devices 122 or 124 have their clocks enabled.

Figure 2:
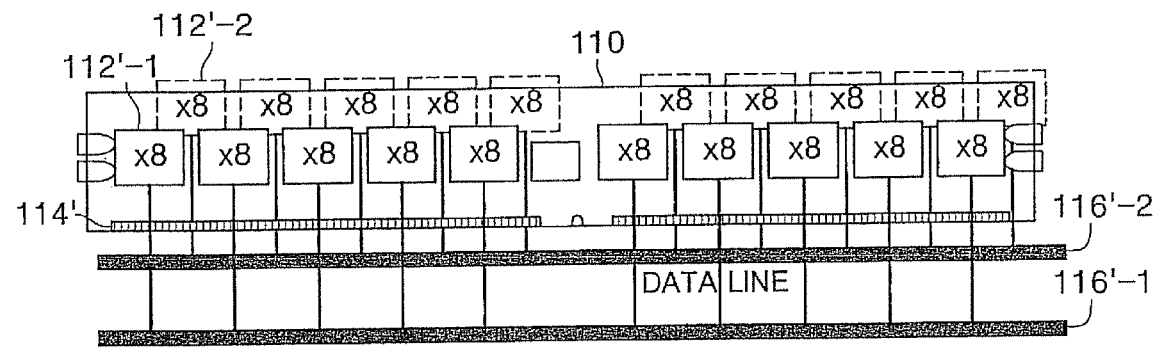
FIG. 2 illustrates a prior art memory module having a rank of two.
Figure 3:
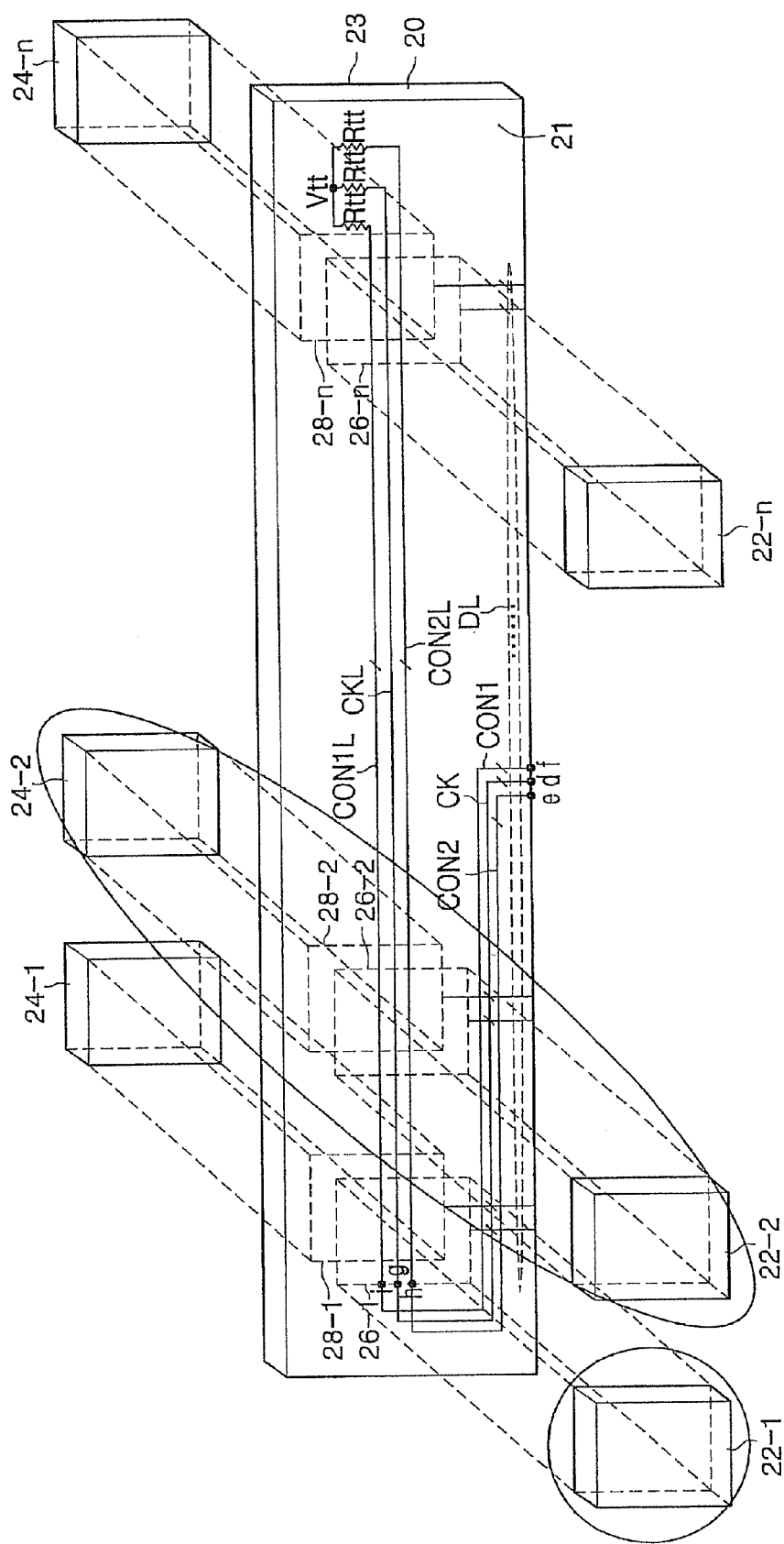
FIG. 3 illustrates a prior art memory module having a rank of two and including stacked die semiconductor memory devices.
Figure 4A:
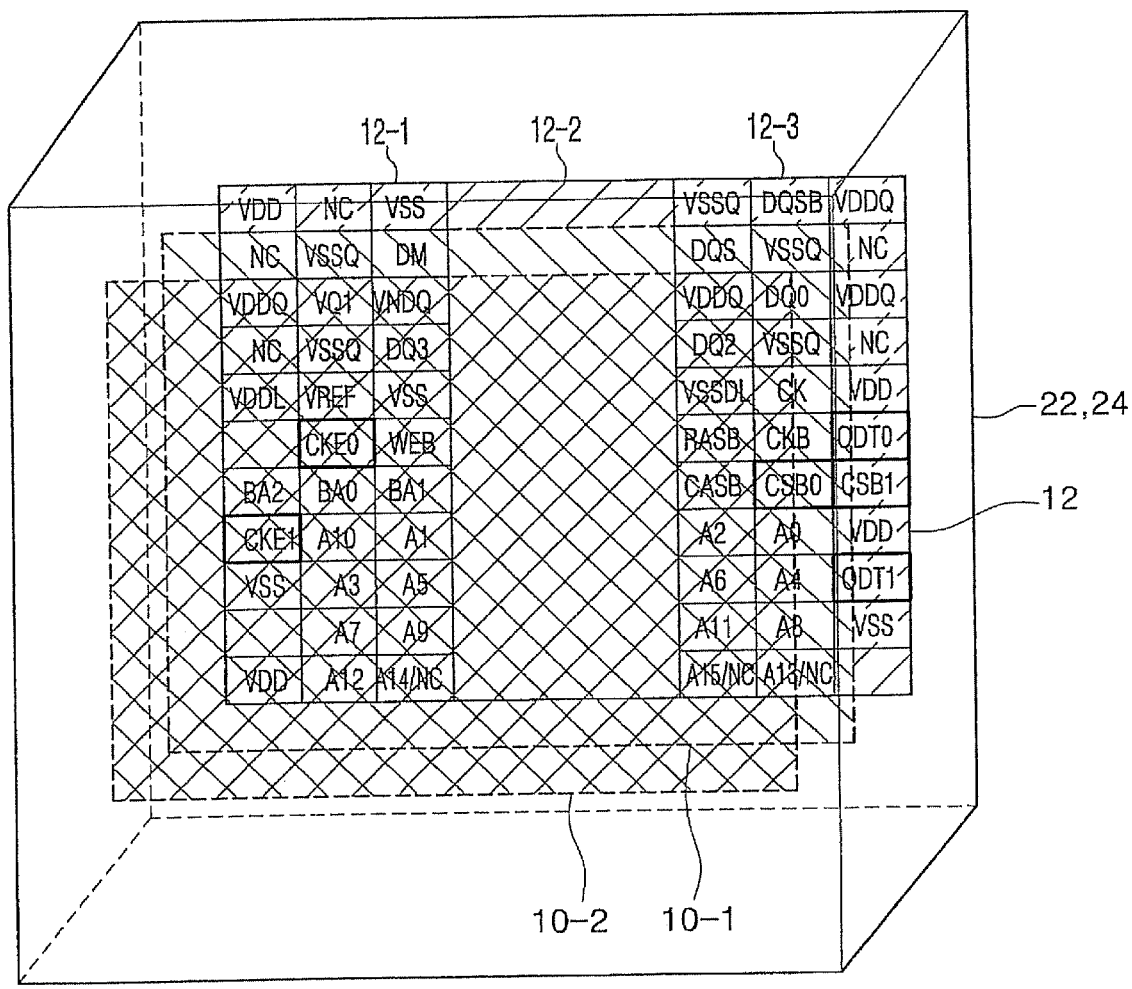
FIG. 4A illustrates the external pad structure of the stacked die semiconductor memory device of FIG. 3.
Figure 4B:
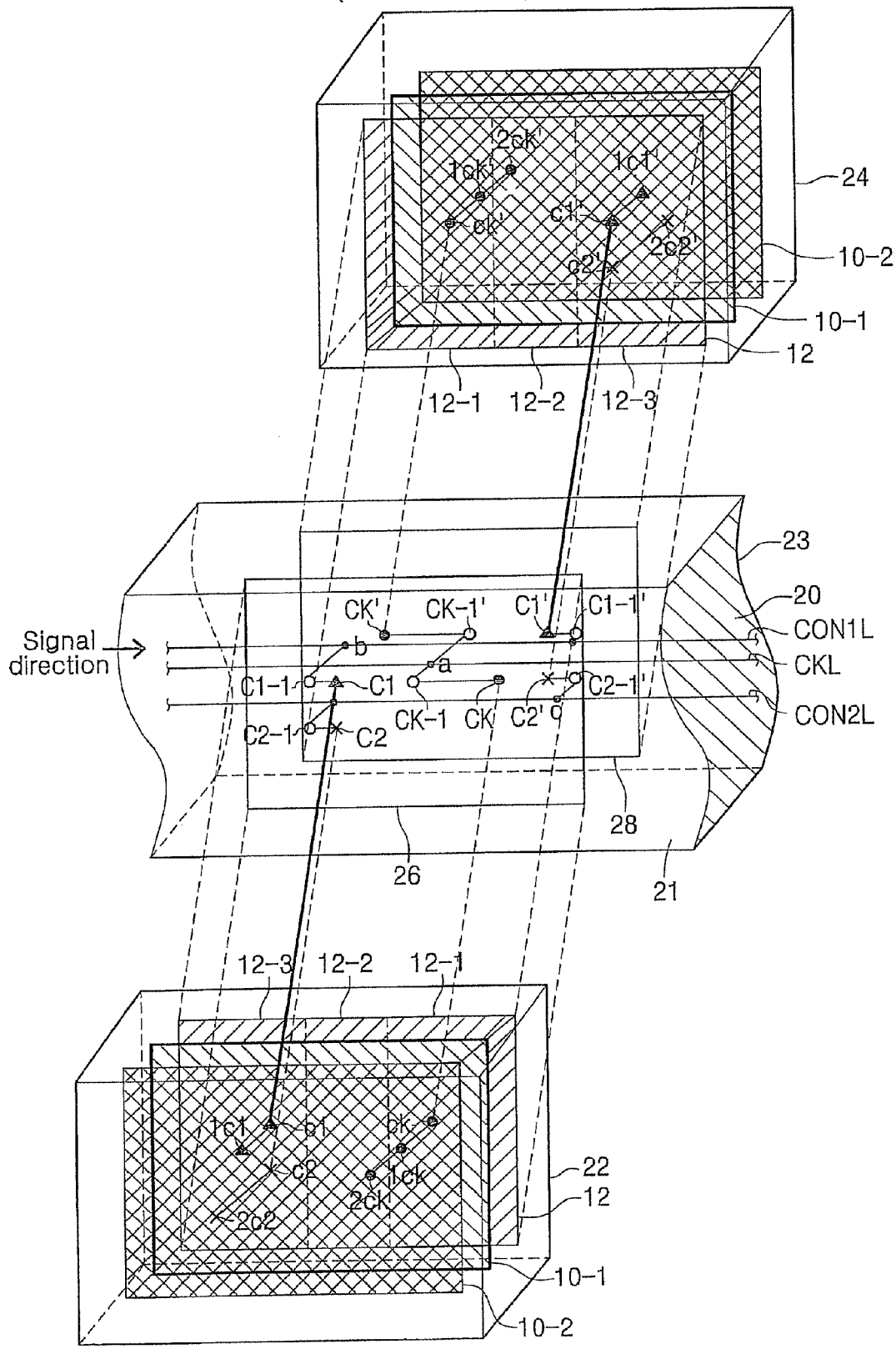
FIG. 4B illustrates in detail the connection of a corresponding pair of memory devices to the support in FIG. 3.
Figure 5:
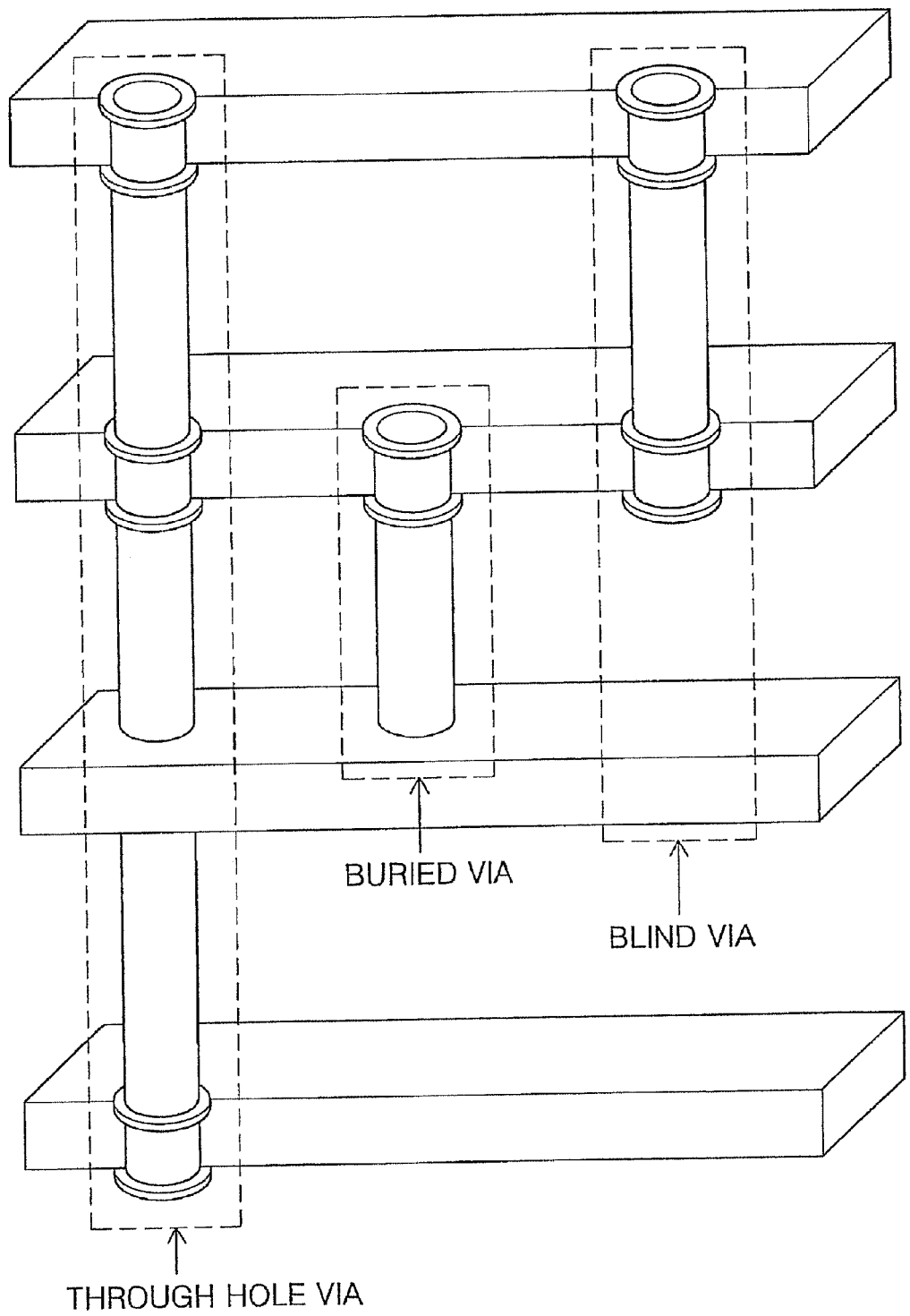
FIG. 5 illustrates well-known types of vias in a printed circuit board.

Returning to FIG. 6, the support 120 includes vias and conductive lines such that the first and second sets of semiconductor memory devices 122 and 124 are connected to terminals (not shown). The terminal may be the same as shown in FIG. 2. FIG. 6 illustrates two example control signal lines CON1L and CON2L as well as the clock signal line CKL. The first and second control signal lines CON1L and CON2L each carry a respective control signal CON1 and CON2, while the clock signal line CKL carries the clock signal CK. However, it will be appreciated that more than just the two illustrated control signal lines CON1L and CON2L exist. For example the first and second control signals CON1 and CON2 may be the first and second clock enable signals CKE0 and CKE1, the first and second chip select signals CS0 and CS1, or the first and second on-die termination signals ODT0 and ODT1. Each control signal line CON1L, CON2L and CKL are terminated by a resistance Rtt connected to a termination voltage Vtt.

Figure 8:
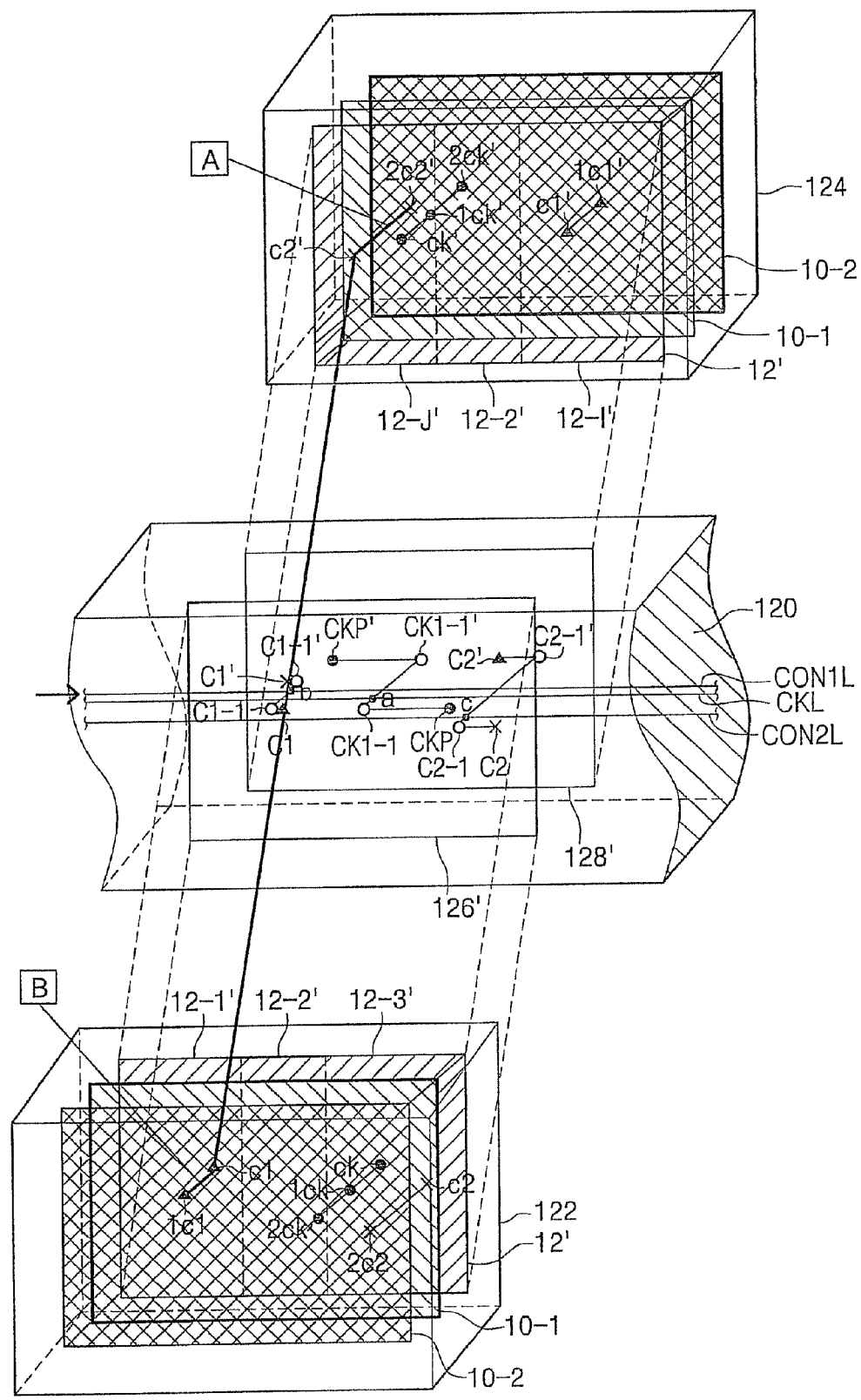
FIG. 8 illustrates in detail the connection of a corresponding pair of memory devices to the support in FIG. 6.

FIG. 8 illustrates the connection of a corresponding pair of memory devices to the support in FIG. 6. The support 120 also includes external connectors (e.g., balls, pads, and/or etc.), and these external connectors will be referred to as pads in the remainder of the disclosure. In particular, FIG. 8 illustrates a portion of the connections of a memory device 122 and oppositely facing, or corresponding, memory device 124 to the support 120. As shown, a pin or pad 1c1 of the first die 10-1 in the memory device 122 is electrically connected to an external pad c1 in the left side array 12-1', and a pin or pad 2c2 of the second die 10-2 in the memory device 122 is electrically connected to an external pad c2 in the right side array 12-3'. In this example, the external pads c1 and c2 may be the first and second chip select external pads cs0 and cs1, respectively. However, it will be understood that the external pads c1 and c2 may represent the clock enable external pads cke0 and cke1, the on-die terminal external pads odt0 and odt1, etc. Furthermore, the clock signal pad 1ck of the first die 10-1 of the memory device 122 and the clock signal pad 2ck of the second die 10-2 are connected to the external clock signal pad ck in the array 12'.

For the opposite facing semiconductor memory device 124, a pin or pad 1c1' of the first die 10-1 in the memory device 124 is electrically connected to an external pad c1' in the left side array 12-1', and a pin or pad 2c2' of the second die 10-2 in the memory device 124 is electrically connected to an external pad c2' in the array right side array 12-3'. In this example, the external pads c1' and c2' may correspond to the first and second chip select external pads cs0 and cs1, respectively. Furthermore, the clock signal pad 1ck' of the first die 10-1 of the memory device 124 and the clock signal pad 2ck' of the second die 10-2 are connected to the external clock signal pad ck' in the array 12'.

As shown in FIG. 8, the semiconductor memory device 124 is flipped with respect to the semiconductor memory device 122 and the left side array 12-1' of the semiconductor memory device 124 faces opposite or mirrors the right side array 12-3' of the semiconductor memory device 122. Likewise, the right signal array 12-3' of the semiconductor memory device 124 faces opposite or mirrors the left side array 12-1' of the semiconductor memory device 122.

The external pad c1 of the memory device 122 is connected to a first control signal pad C1 of the support 120, and the first control signal pad C1 is connected by a first control signal via C1-1 to the first control signal line CON1L at a point b. However, the external pad c2' of the memory device 124 is connected to a first control signal pad C1' of the support 120, and the first control signal pad C1' is connected by a first control signal via C1-1' to the first control signal line CON1L at the point b. As will be appreciated, the first die 10-1 of the memory device 122 and the second die 10-2 of the memory device 124 receive the control signal CON1 on the first control signal line CON1L. Namely, even though external pads c1 and c2 were described as possibly being associated with the first and second chip select signals CS0 and CS1, and even though external pads c1' and c2; were described as possible being associated with the first and second chip select signals CS0 and CS1, it will be appreciated that the embodiments of the present invention are not limited to this association. Instead, in this embodiment, the external pads c1 and c2' are associated with, for example, the first chip select signal CS0.

The external pad c2 of the memory device 122 is connected to a second control signal pad C2 of the support 120, and the second control signal pad C2 is connected by a second control signal via C2-1 to the second control signal line CON2L at a point c. However, the external pad c1' of the memory device 124 is connected to a second control signal pad C2' of the support 120, and the second control signal pad C2' is connected by a second control signal via C2-1' to the second control signal line CON2L at a point c. As will be appreciated, the second die 10-2 of the memory device 122 and the first die 10-of the memory device 124 receive the second control signal CON2 on the second control signal line CON2L. Accordingly, in this embodiment, the external pads c2 and c1' may be associated with the second chip select signal CS1.

The external clock signal pad ck of the memory device 122 is connected to a clock signal pad CKP of the support 120, and the corresponding external clock signal pad ck' of the memory device 124 is connected to a clock signal pad CKP' of the support 120. The clock signal pads CKP and CKP' are connected by a through-hole via CK1-1 to the clock signal line CKL at point a.

As will be readily apparent from the description above, the first dies 10-1 in the memory devices 122 and the second dies 10-2 in the memory devices 124 are controlled (e.g., enabled) as a first set of memory chips, and the second dies 10-2 in the memory devices 122 and the first dies 10-2 in the memory devices 124 are controlled as a second set of memory chips. Accordingly, the rank of the memory module of FIG. 6 is two.

As will be appreciated, by creating an array 12' for the memory devices 122 and 124 in which the pairs of corresponding signal pads (e.g., chip select external pads cs1 and cs0) are split between the left side and right side arrays 12-1' and 12-3', the control signal pads of the right side array 12-3' in the memory devices 124 mirror more closely the control signal pads of the left side array 12-1' in the memory devices 122. And, the control signal pads of the left side array 12-1' in the memory devices 124 mirror more closely the control signal pads of the right side array 12-3' in the memory devices 122. As a result, the control signal pads 12' for the second dies 10-2 in the memory devices 124 are in substantial alignment through the support 120 with the control signal pads 12' for the first dies 10-1 in the memory devices 122. And, the control signal pads 12' of the first dies 10-1 in the memory devices 124 are in substantial alignment through the support 120 with the control signal pads 12' of the second dies 10-2 in the memory devices 124. This allows the control signal pads 12' for the second dies 10-2 in the memory devices 124 to be connected to the same control signal lines, and at the same connection points, as the control signal pads 12' for the first dies 10-1 in the memory devices 122. Similarly, this allows for the control signal pads 12' for the first dies 10-1 in the memory devices 124 to be connected to the same control signal lines, and at the same connection points, as the control signal pads 12' for the second dies 10-2 in the memory devices 122. Accordingly, only three through hole vias in the support 120 are used to connect the pads of the support 120 to the signal lines CON1L, CON2L and CKL.

Furthermore, because the memory devices 122 and 124 have the same points of connection to the first control signal line CON1L and the second control signal line CON2L for the memory devices 122 problems related to skew may be largely eliminated or reduced. Namely, as shown in FIG. 6, the first control signal CON1 traverses a length of the first control signal line CON1L from point f to point i, from point i to point b (in FIG. 8), and from point b to the chips 10-2' and 10-1. The second control signal CON2 traverses a length of the second control signal line CON2L from point e to point h, from point i to point c (in FIG. 8), and from point c to the chips 10-2 and 10-1'. The clock signal CK traverses a length of the clock signal line CKL from point d to point g, from point g to point a and from point a to the chips 10-1, 10-2, 10-1' and 10-2'. By positioning points e, d and f on the memory module, the length from f to b may equal the length from d to a; and the length from e to c may equal the length from d to a.

Figure 9:
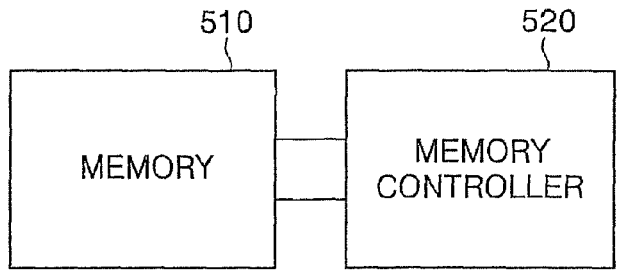
FIGS. 9-14 illustrate additional example embodiments employing a memory module according to example embodiments.

FIG. 9 illustrates another embodiment. As shown, this embodiment includes a memory 510 connected to a memory controller 520. The memory 510 may be the memory module of FIG. 6 described above. The memory controller 520 supplies the input signals for controlling operation of the memory 510. It will be appreciated that the memory controller 520 may control the memory 510 based on received control signals (not shown).

Figure 10:
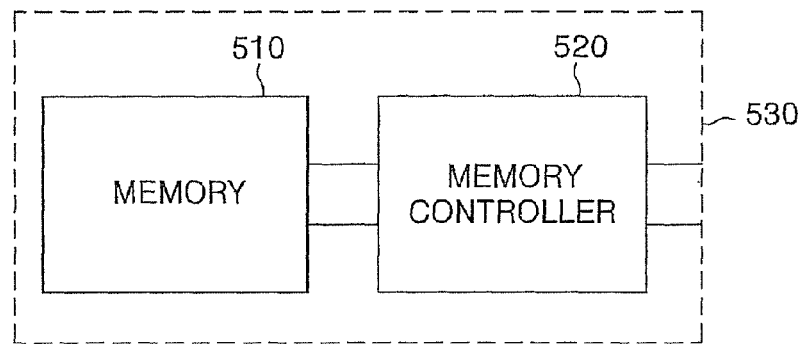

FIG. 10 illustrates yet another embodiment. This embodiment is the same as the embodiment of FIG. 9, except that the memory 510 and memory controller 520 have been embodied as a card 530. For example, the card 530 may be a memory card such as a flash memory card. Namely, the card 530 may be a card meeting any industry standard for use with a consumer electronics device such as a digital camera, personal computer, etc. It will be appreciated that the memory controller 520 may control the memory 510 based on controls signals received by the card 530 from another (e.g., external) device.

Figure 11:
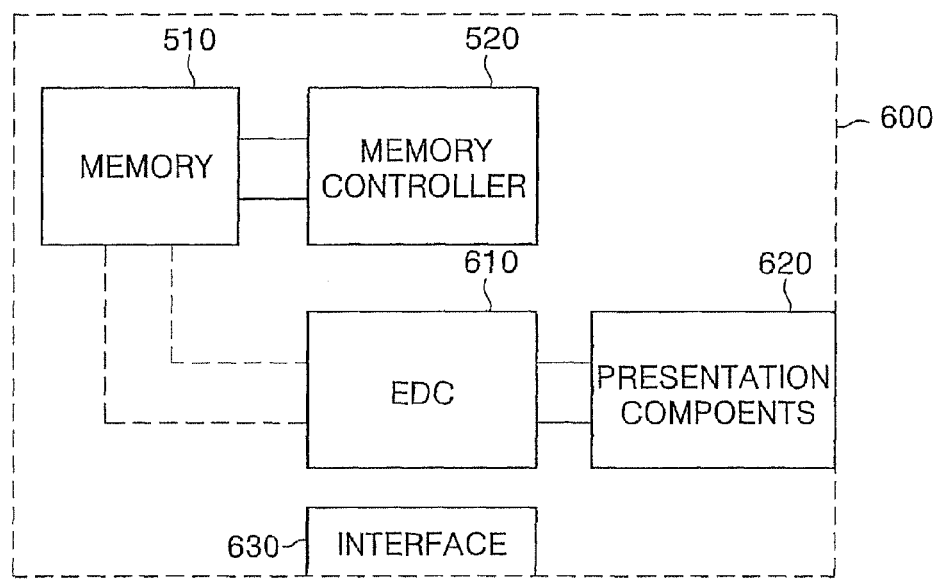

FIG. 11 illustrates a further embodiment. This embodiment represents a portable device 600. The portable device 600 may be an MP3 player, video player, combination video and audio player, etc. As shown, the portable device 600 includes the memory 510 and memory controller 520. The portable device 600 may also includes an encoder and decoder 610, presentation components 620 and interface 630.

Data (video, audio, etc.) is input to and output from the memory 510 via the memory controller 520 by an encoder and decoder (EDC) 610. As shown by the dashed lines in FIG. 11, the data may be directly input to the memory 510 from the EDC 610 and/or directly output from the memory 510 to the EDC 610.

The EDC 610 encodes data for storage in the memory 510. For example, the EDC 610 may perform MP3 encoding on audio data for storage in the memory 510. Alternatively, the EDC 610 may perform MPEG encoding (e.g., MPEG2, MPEG4, etc.) on video data for storage in the memory 510. Still further, the EDC 610 may include multiple encoders for encoding different types of data according to different data formats. For example, the EDC 610 may include an MP3 encoder for audio data and an MPEG encoder for video data.

The EDC 610 may decode output from the memory 510. For example, the EDC 610 may perform MP3 decoding on audio data output from the memory 510. Alternatively, the EDC 610 may perform MPEG decoding (e.g., MPEG2, MPEG4, etc.) on video data output from the memory 510. Still further, the EDC 610 may include multiple decoders for decoding different types of data according to different data formats. For example, the EDC 610 may include an MP3 decoder for audio data and an MPEG decoder for video data.

It will also be appreciated that EDC 610 may include only decoders. For example, already encoded data may be received by the EDC 610 and passed to the memory controller 520 and/or the memory 510.

The EDC 610 may receive data for encoding, or receive already encoded data, via the interface 630. The interface 630 may conform to a known standard (e.g., firewire, USB, etc.). The interface 630 may also include more than one interface. For example, interface 630 may include a firewire interface, a USB interface, etc. Data from the memory 510 may also be output via the interface 630.

The presentation components 620 may present data output from the memory, and/or decoded by the EDC 610, to a user. For example, the presentation components 620 may include a speaker jack for outputting audio data, a display screen for outputting video data, and/or etc.

Figure 12:
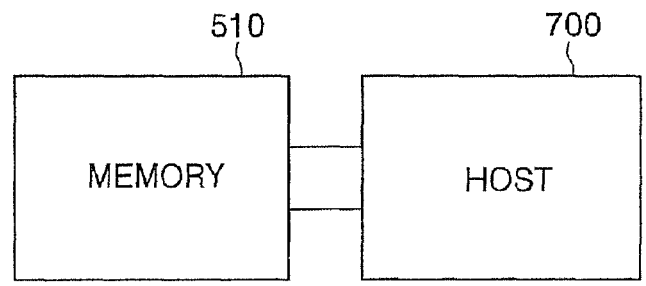

FIG. 12 illustrates a still further embodiment of the present invention. As shown, the memory 510 may be connected with a host system 700. The host system 700 may be a processing system such as a personal computer, digital camera, etc. The host system 700 may use the memory 510 as a removable storage medium. As will be appreciated, the host system 700 supplies the input signals for controlling operation of the memory 510.

Figure 13:
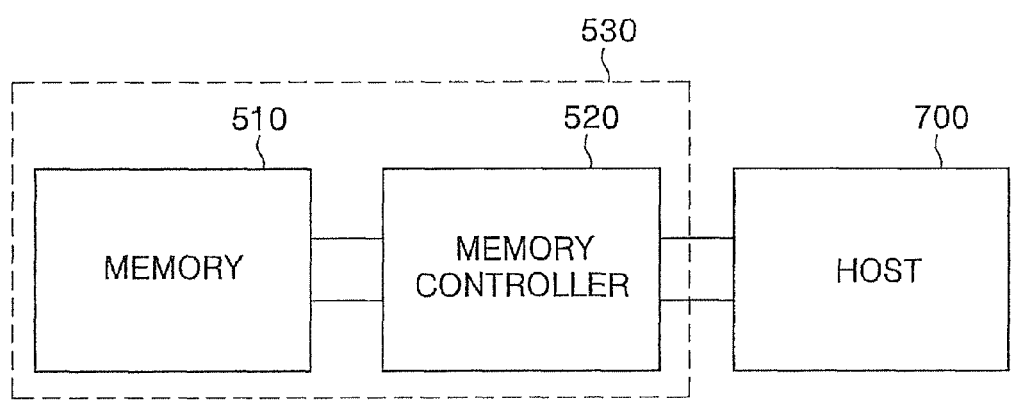

FIG. 13 illustrates an embodiment of the present invention in which the host system 700 is connected to the card 530 of FIG. 12. In this embodiment, the host system 700 applies control signals to the card 530 such that the memory controller 520 controls operation of the memory 510.

Figure 14:
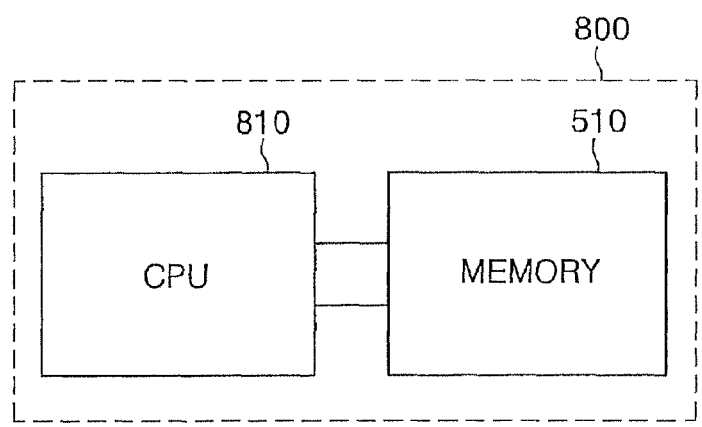

FIG. 14 illustrates a further embodiment of the present invention. As shown, the memory 510 may be connected to a central processing unit (CPU) 810 within a computer system 800. For example, the computer system 800 may be a personal computer, personal data assistant, etc. The memory 510 may be directly connected with the CPU 810, connected via bus, etc. It will be appreciated, that FIG. 14 does not illustrate the full complement of components that may be included within a computer system 800 for the sake of clarity.

The invention being thus described, it will be obvious that the same may be varied in many ways. For example, while the embodiments of the present invention have described with respect to a memory module having a rank of 2, it will be appreciated that the present invention is not limited to a rank of 2. Instead, the rank of the memory module may be greater than or less than 2. Such variations are not to be regarded as a departure from the invention, and all such modifications are intended to be included within the scope of the invention.

We claim:

1. A memory device support, comprising:
   a substrate having a first surface including a clock signal connector and first and second control signal connectors, the first and second control signal connectors being disposed on different areas of the first surface;
   a first control signal line configured to electrically connect a first control signal input terminal and the first control signal connector by way of a first through hole via;
   a second control signal line configured to electrically connect a second control signal input terminal and the second control signal connector by way of a second through hole via; and
   a first clock signal line configured to electrically connect a clock signal input terminal and the clock signal connector by way of a third through hole via.

2. The support of claim 1, wherein a length of the first control signal line from the first control signal input terminal to the first through hole via equals a length of the clock signal line from the clock signal input terminal to the third through hole via, and a length of the second control signal line from the second control signal input terminal to the second through hole via equals the length of the clock signal line from the clock signal input terminal to the third through hole via.

3. The support of claim 1, wherein the first control signal line, the second control signal line, and the clock signal line are disposed within the substrate.

4. A memory module, comprising:
   a substrate having a first surface including a first clock signal connector and first and second control signal connectors, the first and second control signal connectors being disposed on different areas of the first surface;
   a first semiconductor memory device mounted on the first surface, the first semiconductor memory device including at least first and second semiconductor memory dies, the first semiconductor memory die being connected to the first clock signal connector and the first control signal connector, and the second semiconductor memory die being connected to the first clock signal connector and the second control signal connector;
   a first control signal line configured to electrically connect a first control signal input terminal and the first control signal connector by way of a first through hole via;
   a second control signal line configured to electrically connect a second control signal input terminal and the second control signal connector by way of a second through hole via; and
   a clock signal line configured to electrically connect a clock signal input terminal and the first clock signal connector by way of a third through hole via.

5. The memory module of claim 4, wherein a length of the first control signal line from the first control signal input terminal to the first through hole via equals a length of the clock signal line from the clock signal input terminal to the third through hole via, and a length of the second control signal line from the second control signal input terminal to the second through hole via equals the length of the clock signal line from the clock signal input terminal to the third through hole via.

6. The memory module of claim 4, wherein the first control signal line, the second control signal line, and the clock signal line are disposed within the substrate.

7. The memory module of claim 4, wherein the second semiconductor memory die is stacked on the first semiconductor memory die.

8. The memory module of claim 4, wherein the substrate further comprises:
   a second surface oppositely facing the first surface and including a second clock signal connector and third and fourth control signal connectors, the third and fourth control signal connectors being disposed on different areas of the second surface, the third control signal connector being connected with the first control signal connector by way of the first through hole via, the fourth control signal connector being connected with the second control signal connector by way of the second through hole via, the second clock control signal connector being connected with the first clock signal connector by way of the third through hole via.

9. The memory module of claim 8, wherein the first control signal line connects the first control signal input terminal with the third control signal connector by way of the first through hole via, the second control signal line connects the second control signal input terminal with the fourth control signal connector by way of the second through hole via, and the clock signal line connects the clock signal input terminal with the second clock signal connector by way of the third through hole via.

10. The memory module of claim 8, further comprising:
    a second semiconductor memory device mounted on the second surface, the second semiconductor memory device including at least third and fourth semiconductor memory dies, the third semiconductor memory die being connected to the second clock signal connector and the fourth control signal connector, and the fourth semiconductor memory die being connected to the second clock signal connector and the third control signal connector.

11. The memory module of claim 10, wherein the fourth semiconductor memory die is stacked on the third semiconductor memory die.

* * * * *